(12) United States Patent
Nomura et al.

(10) Patent No.: US 9,915,685 B2
(45) Date of Patent: Mar. 13, 2018

(54) ELECTRICAL CURRENT DETECTION SYSTEM

(71) Applicants: DENSO CORPORATION, Kariya, Aichi-pref. (JP); KYUSHU UNIVERSITY, NATIONAL UNIVERSITY CORPORATION, Fukuoka-shi, Fukuoka (JP)

(72) Inventors: Kousuke Nomura, Kariya (JP); Ryosuke Sakai, Kariya (JP); Masaki Takashima, Kariya (JP); Ichiro Sasada, Fukuoka (JP)

(73) Assignees: DENSO CORPORATION, Kariya (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 22 days.

(21) Appl. No.: 15/031,297

(22) PCT Filed: Jan. 22, 2015

(86) PCT No.: PCT/JP2015/000283
§ 371 (c)(1),
(2) Date: Apr. 22, 2016

(87) PCT Pub. No.: WO2015/111408
PCT Pub. Date: Jul. 30, 2015

(65) Prior Publication Data
US 2016/0258985 A1 Sep. 8, 2016

(30) Foreign Application Priority Data

Jan. 23, 2014 (JP) ................................ 2014-010659
Mar. 28, 2014 (JP) ................................ 2014-070021
Jan. 16, 2015 (JP) ................................ 2015-007086

(51) Int. Cl.
*G01R 15/20* (2006.01)
*G01R 33/02* (2006.01)
(Continued)

(52) U.S. Cl.
CPC ......... *G01R 15/205* (2013.01); *G01R 15/207* (2013.01); *G01R 33/09* (2013.01); *G01R 33/091* (2013.01)

(58) Field of Classification Search
CPC .... G01R 15/20; G01R 15/202; G01R 15/205; G01R 15/207; G01R 33/02; G01R 33/06; G01R 33/07; G01R 33/09; G01R 33/093
(Continued)

(56) References Cited

U.S. PATENT DOCUMENTS 5,896,403 A 4/1999 Nagasaki et al.
6,052,813 A 4/2000 Nagasaki et al.
(Continued)

FOREIGN PATENT DOCUMENTS

JP 2005-49185 A 2/2005
JP 2010-2277 A 1/2010
(Continued)

*Primary Examiner* — Arleen M Vazquez
*Assistant Examiner* — Neel Shah
(74) *Attorney, Agent, or Firm* — Posz Law Group, PLC

(57) ABSTRACT

A current detection system includes: first and second magnetic plates arranged in parallel with a predetermined distance; a bus bar for flowing current; and a magneto-electric conversion element converting a lateral direction component of a measurement object magnetic flux, generated by current flowing through the bus bar, to an electric signal. When an external magnetic flux in a lateral direction passes through an accommodation space between the first and second magnetic plates, a trajectory of the external magnetic flux is bent by the first and second magnetic plates, and the accommodation space is divided into a permeable space, (Continued)

through which the external magnetic flux passes, and a non-permeable space, through which the external magnetic flux does not pass. The bus bar is arranged in the accommodation space. The magneto-electric conversion element is arranged in the non-permeable space. The bus bar and the magneto-electric conversion element are lined in the height direction.

8 Claims, 5 Drawing Sheets

(51) Int. Cl.
    *G01R 33/06*     (2006.01)
    *G01R 33/07*     (2006.01)
    *G01R 33/09*     (2006.01)

(58) Field of Classification Search
    USPC ............ 324/117 H, 207.21, 244, 251, 252
    See application file for complete search history.

(56) References Cited

U.S. PATENT DOCUMENTS

| | | | |
|---|---|---|---|
| 6,058,498 A | 5/2000 | Nagasaki et al. | |
| 6,460,155 B1 | 10/2002 | Nagasaki et al. | |
| 2002/0039265 A1* | 4/2002 | Yuasa | B82Y 10/00 360/322 |
| 2002/0199149 A1 | 12/2002 | Nagasaki et al. | |
| 2005/0030018 A1* | 2/2005 | Shibahara | G01R 15/20 324/251 |
| 2006/0033487 A1* | 2/2006 | Nagano | G01R 15/202 324/117 H |
| 2007/0164727 A1* | 7/2007 | Racz | G01R 15/207 324/142 |

FOREIGN PATENT DOCUMENTS

| | | |
|---|---|---|
| JP | 2013-113631 A | 6/2013 |
| WO | 2013/176271 A1 | 11/2013 |

* cited by examiner

ELECTRICAL CURRENT DETECTION SYSTEM

CROSS REFERENCE TO RELATED APPLICATIONS

This application is a U.S. national stage of International Application No. PCT/JP2015/000283 filed on Jan. 22, 2015 and is based on Japanese Patent Applications No. 2014-10659 filed on Jan. 23, 2014, No. 2014-70021 filed on Mar. 28, 2014, and No. 2015-7086 filed on Jan. 16, 2015, the disclosures of which are incorporated herein by reference.

TECHNICAL FIELD

The present disclosure relates to a current detection system having a magnetic plate, a bus-bar and a magneto-electric conversion element.

BACKGROUND ART

Conventionally, as shown in, for example, Patent Literature 1, a current detection device for detecting a current value flowing through a conductor by a magnetic detection element is disclosed, and the current detection device includes a magnetic shielding body for providing a magnetic shielding region and the magnetic detection element arranged in the magnetic shielding region. The magnetic shielding body is a pair of magnetic plates having the same dimensions. The conductor is a bus bar having a wide plate shape. The pair of the magnetic plates are opposed to each other in a Y direction in a state where the magnetic plates sandwich both peripheries of the bus bar in a width direction from an outside of the bus bar. The magnetic detection element is arranged at a center portion of the bus bar in the width direction. The bus bar and the magnetic detection element are arranged in parallel along a Z direction, which is perpendicular to the Y direction. The magnetic detection element detects a magnetic flux along a direction (e.g., the Y direction), which is perpendicular to the Z direction.

As described above, in the current detection device described in the Patent Literature 1, the pair of the magnetic plates are aligned in the Y direction. In this case, when an external magnetic flux along the Z direction is applied to the pair of the magnetic bodies, the external magnetic flux is bent by each of the pair of the magnetic bodies so that the magnetic shielding region is formed between the pair of the magnetic bodies. However, when the external magnetic flux along the Y direction is applied to the pair of the magnetic bodies, the external magnetic flux is not bent substantially by each of the pair of the magnetic bodies, and therefore, the magnetic shielding region is not formed between the pair of the magnetic bodies. On the other hand, the magnetic detection element detects the magnetic flux along the direction (e.g., the Y direction), which is perpendicular to the Z direction. Accordingly, when the external magnetic flux along the Y direction is applied, the magnetic detection element detects not only a magnetic flux corresponding to the current flowing through the bus bar but also the external magnetic flux. As a result, the detection accuracy of the current flowing through the bus bar may be reduced.

PRIOR ART LITERATURES

Patent Literature

Patent Literature 1: JP-2013-113631.

SUMMARY OF INVENTION

It is an object of the present disclosure to provide a current detection system with a detection accuracy of current, reduction of which is restricted.

According to an aspect of the present disclosure, a current detection system includes: a first magnetic plate and a second magnetic plate that are arranged in parallel to each other with a predetermined distance in a height direction; a bus bar, through which current flows in a depth direction perpendicular to the height direction; and a magneto-electric conversion element that converts a component of a measurement object magnetic flux in a lateral direction, which is perpendicular to the height direction and the depth direction, to an electric signal, the measurement object magnetic flux being generated by the current flowing through the bus bar. When an external magnetic flux in the lateral direction passes through an accommodation space, which is provided between the first magnetic plate and the second magnetic plate, a trajectory of the external magnetic flux is bent by the first magnetic plate and the second magnetic plate, and the accommodation space is divided into a permeable space, through which the external magnetic flux passes, and a non-permeable space, through which the external magnetic flux does not pass. The bus bar is arranged in the accommodation space. The magneto-electric conversion element is arranged in the non-permeable space. The bus bar and the magneto-electric conversion element are arranged and lined in the height direction.

Thus, the first magnetic plate and the second magnetic plate are aligned in the height direction. In this case, the trajectory of the magnetic flux in the lateral direction perpendicular to the height direction is bent by the first magnetic plate and the second magnetic plate. Thus, the non-permeable space, through which the external magnetic flux does not pass substantially, is provided. However, in case of the magnetic flux in the height direction, the trajectory of the magnetic flux is not bent by a magnetic plate, so that the component in the height direction maintains to be constant.

Accordingly, different from the above described system, when the bus bar and the magneto-electric conversion element is arranged and lined in the lateral direction in the accommodation space, and the magneto-electric conversion element detects the component of the measurement object magnetic flux in the height direction, the current flowing through the bus bar is not detected with high accuracy since the magneto-electric conversion element detects the external magnetic flux in the height direction. On the other hand, in the above described system, the bus bar and the magneto-electric conversion element are arranged and line in the height direction in the accommodation space, and the magneto-electric conversion element detects the component of the measurement object magnetic flux in the lateral direction. Accordingly, different from the above described comparison system, the reduction of the detection accuracy of the current flowing through the bus bar is restricted since the magneto-electric conversion element does not detect the external magnetic flux in the height direction.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
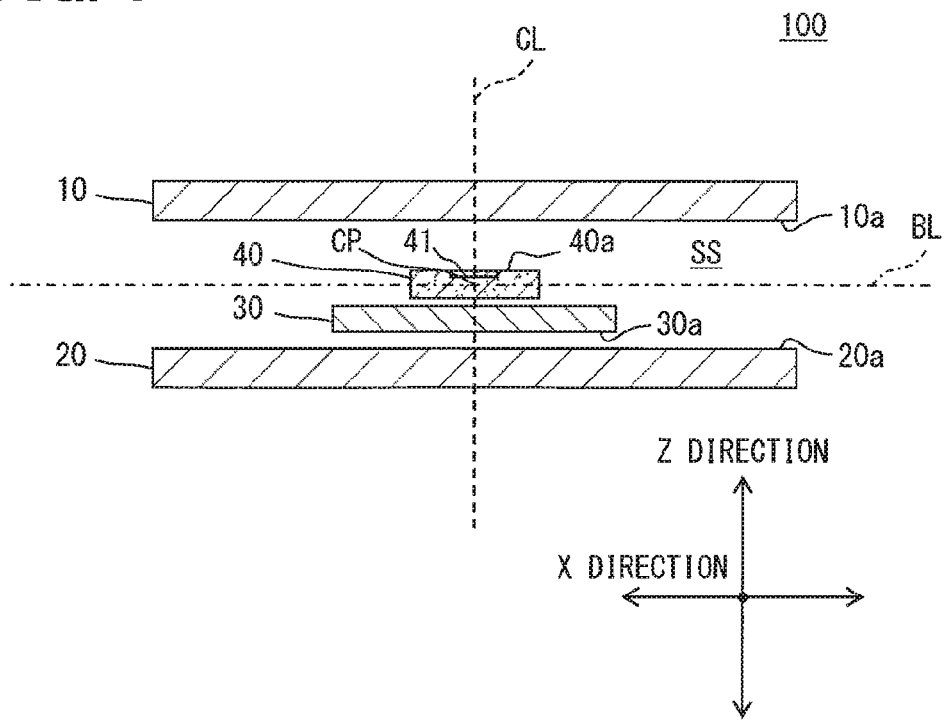
FIG. 1 is a cross sectional view showing an overview construction of a current detection system according to a first embodiment.

Embodiments according to the present disclosure will be explained with reference to drawings.

First Embodiment

A current detection system according to the present embodiment will be explained with reference to FIGS. 1 and 2. Here, in FIG. 2, reference numerals other than the permeable space PS and the non-permeable space NPS are not shown in order to avoid complication.

Three directions having a perpendicular relationship among them are defined as a X direction, a Y direction and a Z direction. A plane determined by the X direction and the Y direction is defined as a X-Y plane, a plane determined by the Y direction and the Z direction is defined as a Y-Z plane, and a plane determined by the Z direction and the X direction is defined as a Z-X plane. The X direction corresponds to a lateral direction, the Y direction corresponds to a depth direction, and the Z direction corresponds to a height direction.

Figure 2:
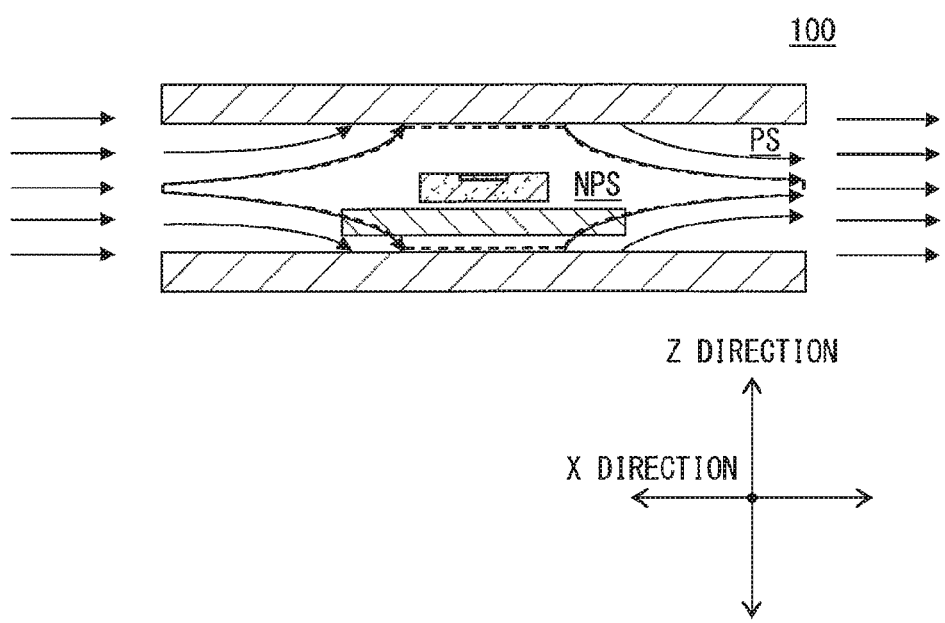
FIG. 2 is a cross sectional view explaining a permeable space and a non-permeable space.

As shown in FIG. 1, the current detection system 100 includes a first magnetic plate 10, a second magnetic plate 20, a bus bar 30, and a semiconductor substrate 40. The magnetic plates 10, 20 are arranged in parallel to each other in the Z direction with a distance therebetween. An accommodation space SS is formed between the magnetic plates 10, 20. The bus bar 30 and the semiconductor substrate 40 are accommodated in the accommodation space SS. The bus bar 30 flows current in the Y direction, and thus, a measurement object magnetic flux is formed. A magneto-electric element 41 for converting the magnetic flux to an electric signal is arranged on the semiconductor substrate 40. The magneto-electric conversion element 41 converts the measurement object magnetic flux to the electric signal.

Each magnetic plate 10, 20 is made of material having higher permeability than air, and prevents the external magnetic flux from penetrating into the accommodation space SS. Each magnetic plate 10, 20 has a principal surface with a flat plane shape in parallel to the X-Y plane, and has a cross sectional shape in the Z-X plane with a rectangular shape. As shown in FIGS. 1 and 2, a short side direction of the rectangular shape is directed to the Z direction, and a long side direction is directed to the X direction. A spacing distance in the Z direction between the principal surfaces 10a, 20a (i.e., inner surfaces) of the magnetic plates 10, 20 is constant so that the principal surfaces have a parallel relationship. Accordingly, the cross sectional shape of the accommodation space SS in the Z-X plane is also a rectangular shape.

A measurement object current flows through the bus bar 30. The bus bar 30 has a rod shape extending in the Y direction. As shown in FIGS. 1 and 2, the cross sectional shape of the bus bar 30 in the Z-X plane is a rectangular shape. The short side direction is in parallel to the Z direction. The long side direction is in parallel to the X direction. As described above, the measurement object current flows along the Y direction. Accordingly, when the measurement object current flows, the measurement object magnetic flux is formed to penetrate the Y-Z plane. The X component of the measurement object magnetic flux is converted into the electric signal by the magneto-electric conversion element 41.

The magneto-electric conversion element 41 is formed on a facing surface 40a of the semiconductor substrate 40, which faces the first magnetic plate 10. The magneto-electric conversion element 41 has a function for converting the component of the measurement object magnetic flux in the X direction into the electric signal. The magneto-electric conversion element 41 according to the present embodiment has a function for converting the measurement object magnetic flux not only in the X direction but also in the X-Y plane into the electric signal. The magneto-electric conversion element 41 according to the present embodiment is a magneto-resistance effect device having a resistance, which is varied with the applied magnetic flux. The magneto-electric conversion element 41 includes a pin layer, in which a magnetization direction is fixed, a free layer, in which the magnetization direction is changed according to the applied magnetic field, and an intermediate layer arranged between the pin layer and the free layer. The magneto-electric conversion element 41 has a property such that a resistance of the magneto-electric conversion element 41 is changed in accordance with an angle between the magnetization direction of the pin layer and the magnetization direction of the free layer. The magnetization direction of the pin layer is directed to one direction along the X-Y plane, and the magnetization direction of the free layer has a property such that the magnetization direction is changed on the X-Y plane. When the intermediate layer has conductivity, the magneto-electric conversion element 41 is a giant magneto-resistance effect device (i.e., GMR). When the intermediate layer has insulation property, the magneto-electric conversion element 41 is a tunnel magneto-resistance effect device (i.e., TMR). Alternatively, the magneto-electric conversion element 41 may be an anisotropic magneto-resistance effect device (i.e., AMR) instead of the GMR and the TMR. Here, the above described facing surface 40a corresponds to a forming surface.

Next, characteristics of the current detection system 100 will be explained as follows. As described above, the magnetic plates 10, 20 are arranged in parallel to each other in the Z direction with a predetermined distance therebetween. The bus bar 30 and the semiconductor substrate 40 are accommodated in the accommodation space SS, which is formed between the magnetic plates 10, 20. As shown in FIG. 2, when the external magnetic flux in the X direction passes through the accommodation space SS, the trajectory of the magnetic flux is bent by the magnetic plates 10, 20. Accordingly, the accommodation space SS is mainly divided into the permeable space PS, through which the external magnetic flux passes, and a non-permeable space NPS (i.e., space surrounded with a broken line), through which the external magnetic flux does not pass. Here, the dimensions and the shielding level of the non-permeable space NPS, through which the external magnetic flux does not pass, are determined by an intention of a designer how much the external magnetic flux is shielded. The dimensions of the non-permeable space NPS are in proportion to formation material and a lateral width of each magnetic plate 10, 20 and a separation distance (i.e., a gap) in the Z direction between the magnetic plates 10, 20. Accordingly, the designer appropriately controls these parameters, so that the designer designs the non-permeable space NPS having a required shielding level and required dimensions. In the present embodiment, the shielding level of the external magnetic flux in the non-permeable space NPS is equal to or smaller than 99%. In order to realize the shield having this degree, the formation material is selected to be permalloy, the lateral width is 20 millimeters, and the gap is 5 millimeters. Here, as described above, since the principal surface of each magnetic plate 10, 20 has a flat plate shape in the X-Y plane, the magnetic plates 10, 20 provide a function for shielding not only the external magnetic flux in the X direction but also the external magnetic flux in the X-Y plane.

The magneto-electric conversion element 41 is arranged in the above described non-permeable space NPS, and the magneto-electric conversion element 41 and the bus bar 30 are arranged in parallel to each other in the Z direction. The center CP of the accommodation space SS is positioned at the center of the non-permeable space NPS. A standard line BL (i.e., a dashed-dotted line shown in FIG. 1) penetrates the center CP in the X direction, and the center of the magneto-electric conversion element 41 is disposed on the standard line BL. Further, a center line CL (i.e., a broken line in FIG. 1) in the Z direction penetrates a geometric center of each of the magneto-electric conversion element 41 and the bus bar 30 and a geometric center of each of the magnetic plates 10, 20. Furthermore, distances in the X direction between two ends of each magnetic plate 10, 20 and the geometric center of the bus bar 30 are the same. And, distances between two ends of each magnetic plate 10, 20 and the geometric center of the magneto-electric conversion element 41 are the same. Finally, the opposing surface 40*a* of the semiconductor substrate 40, on which the magneto-electric conversion element 41 is formed, and the inner surface 10*a* of the first magnetic plate 10 face each other in the Z direction. The separation distance between the facing surface 40*a* and the inner surface 10*a* is constant, so that the facing surface 40*a* and the inner surface 10*a* have a parallel relationship. Similarly, the separation distance between the facing surface 30*a* of the bus bar 30 and the inner surface 20*a* of the second magnetic plate 20 is constant, so that the facing surface 30*a* and the inner surface 20*a* have a parallel relationship. Thus, the current detection system 100 has a line symmetric shape with respect to the center line CL on the Z-X plane.

Next, functions and effects of the current detection system 100 according to the present embodiment will be explained as follows. As described above, the first magnetic plate 10 and the second magnetic plate 20 are aligned in the Z direction. In this case, the trajectory of the magnetic flux in the X direction perpendicular to the Z direction is bent by the first magnetic plate 10 and the second magnetic plate 20. Thus, the non-permeable space NPS, in which the external magnetic flux does not penetrate mainly, is formed. However, when the magnetic flux is in parallel to the Z direction, the trajectory of the magnetic flux is not substantially bent by the magnetic plate, so that the component of the magnetic flux in the Z direction is maintained to be constant.

Accordingly, different from the current detection system 100 shown in the present embodiment, when the bus bar and the magneto-electric conversion device are aligned in the X direction in the accommodation space, and the magneto-electric conversion device detects the component of the measurement object magnetic flux in the Z direction, it is difficult to detect the current flowing through the bus bar with high accuracy since the external magnetic flux in the Z direction is detected by the magneto-electric conversion device. On the other hand, in the current detection system 100, the bus bar 30 and the magneto-electric conversion element 41 are aligned in the Z direction adjacently in the accommodation space SS, and the magneto-electric conversion element 41 detects the component of the measurement object magnetic flux in the X direction. Accordingly, different from the above described comparison constitution, the magneto-electric conversion element 41 does not detect the external magnetic flux in the Z direction, so that the reduction of the detection accuracy of the current flowing through the bus bar 30 is restricted.

In the present embodiment, the magneto-electric conversion element 41 is the magneto-resistance effect device. However, the magneto-electric conversion element 41 is not limited to the above example. Alternatively, the magneto-electric conversion element 41 may be another device as long as the device converts the magnetic signal to the electric signal. For example, the magneto-electric conversion element 41 may be a Hall element for converting the magnetic flux in the X direction to the voltage according to the Hall effect.

In the present embodiment, the shielding level of the external magnetic flux in the non-permeable space NPS is set to be equal to or smaller than 99%. However, as described in the present embodiment, it is merely a feature determined by the designer how much the external magnetic flux is shielded. Thus, it is not limited to the above example. For example, the shielding level may be 90%.

In the present embodiment, the formation material of each magnetic plate 10, 20 is permalloy, the lateral width is 20 millimeters, and the gap is set to be 5 millimeters. However, the formation material and the lateral width of each magnetic plate 10, 20 and the gap between the plates 10, 20 may be changeable in accordance with the shielding level. The formation material of each magnetic plate 10, 20 may be a magnetic steel sheet, the lateral width may be 30 millimeters, and the gap may be 5 millimeters. Even in this condition, the external magnetic flux can be reduced to be equal to or smaller than 99%.

In the present embodiment, the thickness (i.e., a length in the Z direction) of each magnetic plate 10, 20 is not defined, the thickness of each magnetic plate 10, 20 is appropriately determined according to the external magnetic flux and the measurement object magnetic flux so as not to saturate the magnetic flux inside of the magnetic plate 10, 20. When each of the magnetic plates 10, 20 is not saturated, the thickness does not depend on formation of each of the permeable space PS and the non-permeable space NPS.

In the present embodiment, each magnetic plate 10, 20 shields not only the external magnetic flux in the X direction but also the external magnetic flux in the X-Y plane. However, when the magneto-electric conversion element 41 provides the function for converting the magnetic flux only in the X direction to the electric signal, each magnetic plate 10, 20 may provide a function for shielding only the external magnetic flux in the X direction.

In the present embodiment, the center CP of the accommodation space SS is positioned at the center of the non-permeable space NPS. Alternatively, the center CP of the accommodation space SS may not coincide with the center of the non-permeable space NPS.

In the present embodiment, the center of the magneto-electric conversion element 41 is disposed on the standard line BL, which passes through the center CP of the accommodation space SS along the X direction. Alternatively, the magneto-electric conversion element 41 may not be disposed on the standard line BL.

In the present embodiment, the center line CL passes through the geometric center of each of the magneto-electric conversion element 41 and the bus bar 30 and the geometric center of each of the magnetic plates 10, 20. Alternatively, the center line CL may not pass through the geometric center of each of the magneto-electric conversion element 41 and the bus bar 30 and the geometric center of each of the magnetic plates 10, 20. Further, the geometric center of each of the magneto-electric conversion element 41 and the bus bar 30 and the geometric center of each of the magnetic plates 10, 20 may not be aligned in the Z direction.

In the present embodiment, the distances in the X direction between two ends of each magnetic plate 10, 20 and the geometric center of the bus bar 30 are the same, and the distances between two ends of each magnetic plate 10, 20 and the geometric center of the magneto-electric conversion element 41 are the same. Alternatively, the distances in the X direction between two ends of each magnetic plate 10, 20 and the geometric center of the bus bar 30 may be different, and the distances between two ends of each magnetic plate 10, 20 and the geometric center of the magneto-electric conversion element 41 may be different.

In the present embodiment, the separation distance between the facing surface 40a of the semiconductor substrate 40 and the inner surface 10a of the first magnetic plate 10 is constant, so that the facing surface 40a and the inner surface 10a have a parallel relationship. Alternatively, the separation distance between the facing surface 40a and the inner surface 10a may not be constant, so that the facing surface 40a and the inner surface 10a may not have a parallel relationship.

In the present embodiment, the separation distance between the facing surface 30a of the bus bar 30 and the inner surface 20a of the second magnetic plate 20 is constant, so that the facing surface 30a and the inner surface 20a have a parallel relationship. Alternatively, the separation distance between the facing surface 30a and the inner surface 20a may not be constant, so that the facing surface 30a and the inner surface 20a may not have a parallel relationship.

In the present embodiment, the current detection system 100 has a line symmetric shape with respect to the center line CL on the Z-X plane. Alternatively, the current detection system 100 may not have a line symmetric shape with respect to the center line CL.

Figure 3:
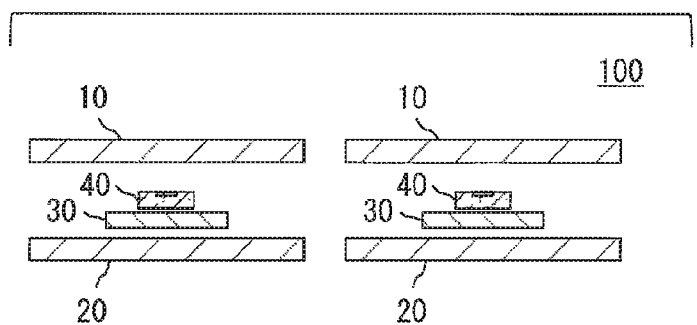
FIG. 3 is a cross sectional view showing a modification of the current detection system.
Figure 4:
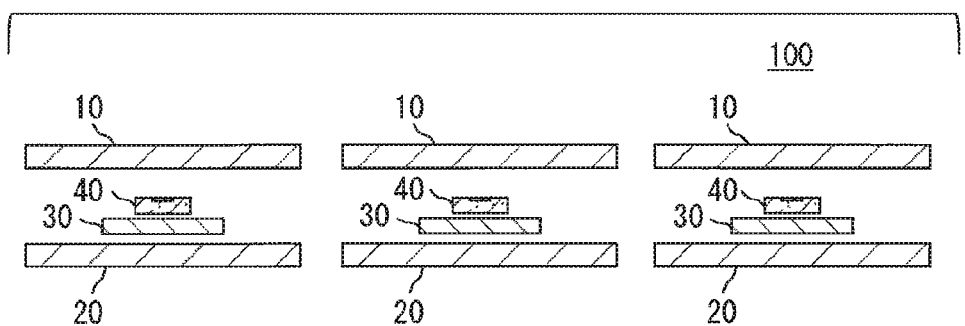
FIG. 4 is a cross sectional view showing a modification of the current detection system.
Figure 5:
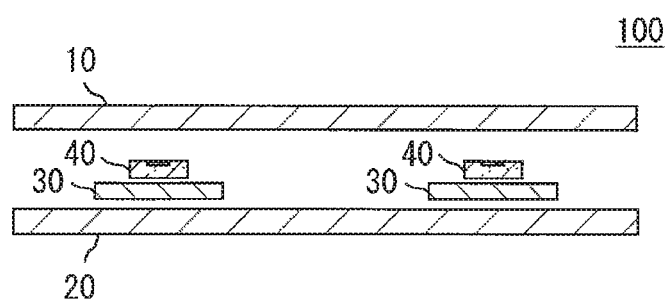
FIG. 5 is a cross sectional view showing a modification of the current detection system in FIG. 3.
Figure 6:
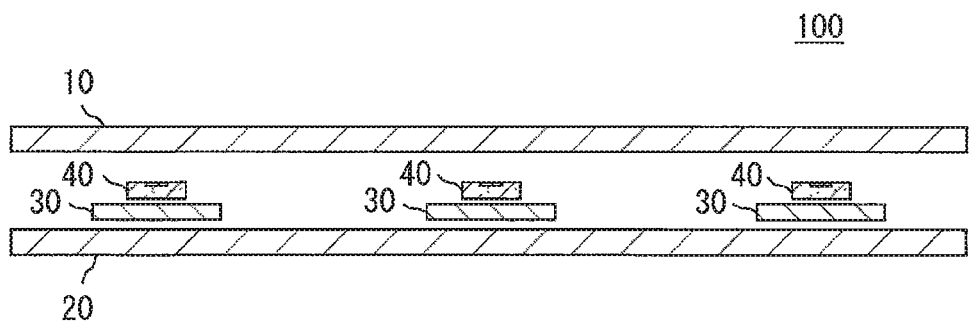
FIG. 6 is a cross sectional view showing a modification of the current detection system in FIG. 4.

In the present embodiment, the current detection system 100 includes a pair of magnetic plates 10, 20, one bus bar 30 and one semiconductor substrate 40 corresponding to the pair of magnetic plates 10, 20. However, the number of magnetic plates 10, 20, the number of bus bars 30, and the number of semiconductor substrates 40 are not limited, respectively. For example, as shown in FIG. 3, the current detection system 100 may include two pairs of magnetic plates 10, 20, two bus bars 30 and two semiconductor substrates 40 corresponding to two pairs of magnetic plates 10, 20. Alternatively, as shown in FIG. 4, the current detection system 100 may include three pairs of magnetic plates 10, 20, three bus bars 30 and three semiconductor substrates 40 corresponding to two pairs of magnetic plates 10, 20. Further, alternatively, the current detection system 100 may include one pair of magnetic plates 10, 20, two bus bars 30 and two semiconductor substrates 40 corresponding to the one pair of magnetic plates 10, 20. Additionally, alternatively, as shown in FIG. 6, the current detection system 100 may include one pair of magnetic plates 10, 20, three bus bars 30 and three semiconductor substrates 40 corresponding to the one pair of magnetic plates 10, 20. Thus, the number of elements is reduced, and the dimensions are minimized.

Figure 7:
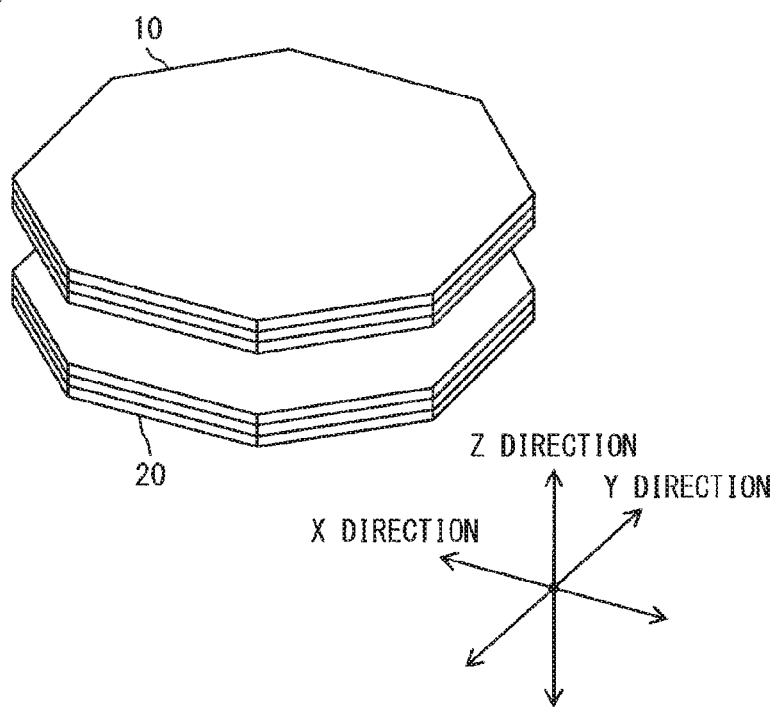
FIG. 7 is a cross sectional view showing a modification of the magnetic plate.

In the present embodiment, a shape (i.e., a planar shape) of each magnetic plate 10, 20 on the X-Y plane is not specified. The planar shape of each magnetic plate 10, 20 may not be limited as long as the plates 10, 20 provide the non-permeable space NPS. For example, the planar shape of each magnetic plate 10, 20 may be a polygonal shape such as a rectangular and a circular shape. FIG. 7 shows an example that the planar shape of each magnetic plate 10, 20 is an octagon shape. Thus, when the planar shape approaches the circular shape, the shielding level of the external magnetic flux on the X-Y plane is homogenized.

Figure 8:
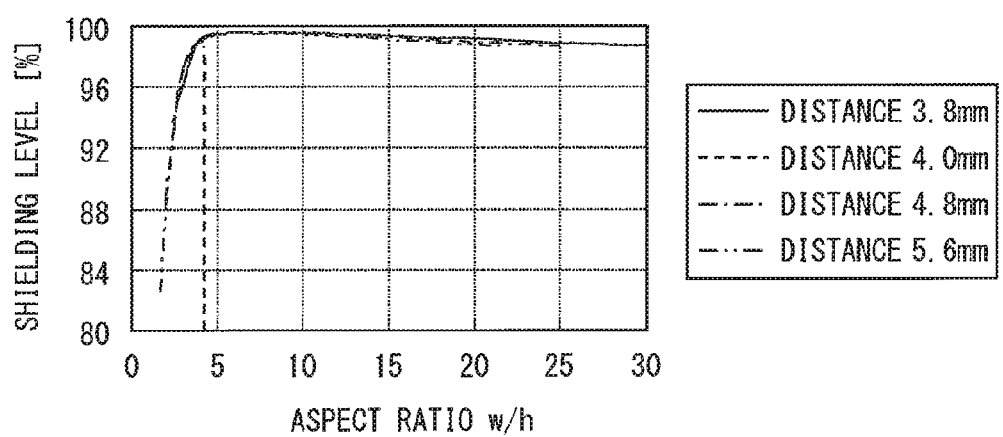
FIG. 8 is a graph showing a relationship between a shielding level and an aspect ratio when a spacing distance is varied.
Figure 9:
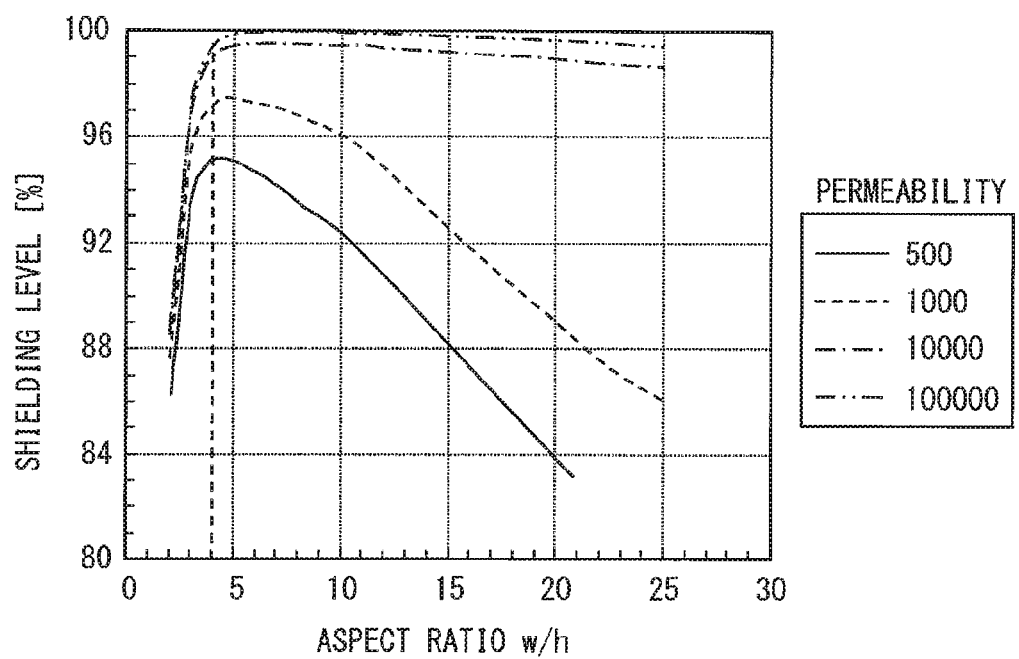
FIG. 9 is a graph showing a relationship between a shielding level and an aspect ratio when permeability is varied.

In each embodiment, the relationship between the lateral width of each magnetic plate 10, 20 and the separation distance therebetween is not described. However, as shown in FIG. 1, when the separation distance in the Z direction between the inner surface 10a of the first magnetic plate 10, a part of which faces the magneto-electric conversion element 41, and the inner surface 20a of the second magnetic plate 20, a part of which faces the bus bar 30, is constant and the inner surface 10a and the inner surface 20a have a parallel relationship, the following equation may be satisfied. Specifically, the separation distance in the Z direction between inner surface 10a and the inner surface 20a is defined as H, and the lateral width (the maximum length) of each of the first magnetic plate 10 and the second magnetic plate 20 in the X direction is defined as W. As shown in FIGS. 8 and 9, the aspect ratio W/H between the separation distance H and the lateral width W may be equal to or larger than 4.

FIG. 8 shows a relationship between the shielding level and the aspect ratio W/H when the separation distance H between the magnetic plates 10, 20 is changed from 3.8 millimeters to 5.6 millimeters. FIG. 9 shows a relationship between the shielding level and the aspect ratio W/H when the permeability of the magnetic plates 10, 20 is almost changed from 500 Wb to 100000 Wb. As shown in FIG. 8, the shielding level does not depend on the separation distance p H but depends on the aspect ratio W/H. Further, as shown in FIG. 9, the shielding level goes up and down according to the permeability (i.e., the formation material of the magnetic plates 10, 20). The behavior of the shielding level depends on the aspect ratio W/H.

As shown in FIGS. 8 and 9, the shielding level is maximized when the aspect ratio W/H is four. As the aspect ratio W/H increases, the shielding level is gradually reduced. Accordingly, as described above, it is preferable that the aspect ratio W/H is equal to or larger than 4. Here, for example, when the shielding level of the external magnetic flux is limited to be equal to or larger than 88%, the aspect ratio W/H is set to be in a range between 4 and 15 according to FIGS. 8 and 9. The lower limit of the aspect ratio W/H is four. The upper limit of the aspect ratio W/H is determined by the intention of the designer how much the shielding level is set. Thus, since the upper limit of the aspect ratio W/H is determined by the intention of the designer, the upper limit is appropriately selected.

Here, for example, when the planar shape of the magnetic plate 10, 20 is the circular shape, the lateral width W corresponds to the diameter of the magnetic plate 10, 20 around the center. The material having the permeability of about 500 is Ni—Zn ferrite. The material having the permeability of about 1000 is soft iron. Further, the material having the permeability of about 10000 is magnetic steel sheet, the material having the permeability of about 100000 is 45%-Ni permalloy. The permeability of these materials is different and depends on a manufacturer and a grade of the materials. Accordingly, the word "about" is added, as described above.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A current detection system comprising:
   a first magnetic plate and a second magnetic plate that are arranged in parallel to each other with a predetermined distance in a height direction;
   a bus bar, through which current flows in a depth direction perpendicular to the height direction; and
   a magneto-electric conversion element that converts a component of a measurement object magnetic flux in a lateral direction, which is perpendicular to the height direction and the depth direction, to an electric signal, the measurement object magnetic flux being generated by the current flowing through the bus bar, wherein:
   when an external magnetic flux in the lateral direction passes through an accommodation space, which is provided between the first magnetic plate and the second magnetic plate, a trajectory of the external magnetic flux is bent by the first magnetic plate and the second magnetic plate, and the accommodation space is divided into a permeable space, through which the external magnetic flux passes, and a non-permeable space, through which the external magnetic flux does not pass;
   the bus bar is arranged in the accommodation space;
   the magneto-electric conversion element is arranged in the non-permeable space;
   the bus bar and the magneto-electric conversion element are arranged and lined in the height direction;
   a separation distance in the height direction between an inner surface of the first magnetic plate, a part of which faces the magneto-electric conversion element, and a facing surface of the second magnetic plate, a part of which faces the bus bar, is constant, and the inner surface and the facing surface have a parallel relationship;
   the separation distance in the height direction between the inner surface of the first magnetic plate and the facing surface of the second magnetic plate is defined as H;
   a maximum length of each of the first magnetic plate and the second magnetic plate in the lateral direction is defined as W; and
   an aspect ratio defined as W/H between the separation distance defined as H and the maximum length defined as W is equal to or larger than four.

2. The current detection system according to claim 1, wherein:
   a center of the magneto-electric conversion element is positioned on a standard line, which passes through a center of the accommodation space in the lateral direction.

3. The current detection system according to claim 1, wherein:
   a center line in the height direction passes through a geometric center of each of the bus bar and the magneto-electric conversion element and a geometric center of each of the first magnetic plate and the second magnetic plate.

4. The current detection system according to claim 3, wherein:
   distances in the lateral direction between two ends of each of the first magnetic plate and the second magnetic plate and the geometric center of the bus bar are same; and
   distances in the lateral direction between two ends of each of the first magnetic plate and the second magnetic plate and the geometric center of the magneto-electric conversion element are same.

5. The current detection system according to claim 4, further comprising:
   a semiconductor substrate, on which the magneto-electric conversion element is arranged, wherein:
   a formation surface of the semiconductor substrate, on which the magneto-electric conversion element is arranged, and an inner surface of the first magnetic plate are opposed to each other in the height direction; and
   a separation distance between the formation surface of the semiconductor substrate and the inner surface of the first magnetic plate is constant, and the formation surface and the inner surface have a parallel relationship.

6. The current detection system according to claim 4, wherein:
   the bus bar and the second magnetic plate are opposed to each other in the height direction; and
   a separation distance between a facing surface of the bus bar facing the second magnetic plate and a facing surface of the second magnetic plate facing the bus bar is constant, and two facing surfaces have a parallel relationship.

7. The current detection system according to claim 1, wherein:
   a cross sectional shape of the bus bar on a plane, which is provided by the height direction and the lateral direction, is a rectangular shape;
   a long side direction of the rectangular shape is directed to the lateral direction; and
   a short side direction of the rectangular shape is directed to the height direction.

8. The current detection system according to claim 1, wherein:
   the bus bar includes a plurality of bus bar elements;
   the magneto-electric conversion element includes a plurality of magneto-electric conversion members; and
   each bus bar element corresponds to one magneto-electric conversion member.

* * * * *